United States Patent [19]
Rao

[11] Patent Number: 5,991,191
[45] Date of Patent: Nov. 23, 1999

[54] METHODS AND CIRCUITS FOR SINGLE-MEMORY CELL MULTIVALUE DATA STORAGE

[75] Inventor: G.R. Mohan Rao, Dallas, Tex.

[73] Assignee: Silicon Aquarius, Inc., Richardson, Tex.

[21] Appl. No.: 08/985,943

[22] Filed: Dec. 5, 1997

[51] Int. Cl.[6] .................................................. G11C 11/00
[52] U.S. Cl. ............................................ 365/154; 365/226
[58] Field of Search .................................. 365/154, 226, 365/185.03

[56] References Cited

U.S. PATENT DOCUMENTS

| | | | |
|---|---|---|---|
| 4,855,803 | 8/1989 | Azumai et al. | 365/154 |
| 5,051,958 | 9/1991 | Arakawa | 365/154 |
| 5,353,248 | 10/1994 | Gupta | 365/154 |
| 5,365,475 | 11/1994 | Matsumura et al. | 365/154 |

OTHER PUBLICATIONS

1997 IEEE Internatl Solid–State Circuits Conf. pp. 74 & 75 "TP4.6: A 4–Level Storage 4 Gb DRAM" by Murotani, Naritake, Matano, Ohtsuki, Kasai, Koga, Koyama, Nakajima, Yamaguchi, Watanabe & Okuda.

Primary Examiner—Son T. Dinh
Attorney, Agent, or Firm—James J. Murphy, Esq.; Winstead Sechrest & Minick, P.C.

[57] ABSTRACT

Multivalued memory cell 300 includes a latch 300 having a latching node operating between a variable voltage rail and a fixed voltage rail. Circuitry 303 allows for latching of node to a voltage level of the variable voltage rail, the voltage level at the latched node representing a data value. Circuitry 303 provides for the outputing of the voltage level from the latched node.

17 Claims, 2 Drawing Sheets

METHODS AND CIRCUITS FOR SINGLE-MEMORY CELL MULTIVALUE DATA STORAGE

BACKGROUND OF THE INVENTION

1. Field of the Invention

The present invention relates in general to electronic memories and in particular to methods and circuits for single-memory cell multivalued data storage.

2. Description of Related Art

Current processing systems operate on binary data wherein a logic 1 is represented by a high voltage level (approximately Vcc, typically 3.3 or 5V) and a logic 0 is represented by a low voltage level (approximately Vss, typically 0V or ground). Consequently, conventional random access memory cells, dynamic (DRAM) or static (SRAM) charge a cell capacitor to the high voltage level to store a logic 1 and discharge the capacitor to the low voltage level to store a logic 0. During a read in DRAM's, the voltage on the cell capacitor (which may have drifted due to leakage) is differentially sensed against a reference voltage set between Vcc and Vss and then, depending on the result, restored by latching to the full Vcc or Vss level. Data from the cell is similarly output to the periphery and ultimately outside the DRAM device itself by driving various input/output (I/O) lines to approximately Vcc or Vss.

One of the main thrusts of current DRAM development efforts is to provide for the storage of more bits per DRAM chip (storage capacity). One means for accomplishing this goal is to increase DRAM cell density (i.e., the number of cells per given chip area). This requires the development of advanced circuit design and fabrication techniques to pack smaller cells into denser arrays, which is a time consuming process. Further, as DRAM cells become smaller and the arrays more dense, device physics increasingly become a limiting factor in the pace of progress in the development of new DRAMs. In any event, the development of new high cell-density DRAMs may take years to advance the design from theory to a commercially viable product.

Proposals have been made to increase memory capacity (for both volatile memory, such as DRAM, and non-volatile memory such as flash memory) by storing multiple bits per cell. In one approach, more than the traditional two voltage levels can be impressed on the storage mechanism of a cell, with each voltage level representing a different data value. For example, assume that for a given cell, data can be stored as one of four allowed voltage levels. A voltage of 0V can then be used to represent a two bit logic word "00", a voltage of 1V to represent a logic "01", a voltage of 2V to represent a logic "10" and a voltage of 3V to represent a logic "11". In this fashion, an MSB and an LSB can be stored in a single cell. The exact voltages and the number of voltage levels used vary from scheme to scheme.

The actual implementation of these multivalued memories presents a number of problems. For instance, Murotani et al. (1997 IEEE International Solid State Circuit Conference, Digest of Technical Papers, pp 74–75, 1997) have proposed a 4-level storage device in which both an MSB and an LSB can be stored in a single cell as a function of capacitor voltage. Disadvantageously, this scheme requires two sense and restore cycles be performed during a read operation, one to sense the cell capacitor voltage against a first reference voltage to detect the MSB, and a second to sense the cell capacitor voltage against a second reference voltage to detect the LSB. At a minimum, this scheme results in greater DRAM latency, which is already at a premium for most state of the art applications not to mention a complex sense restore scheme. Further, the Murotani circuitry is more complex and consumes more space on the integrated circuit chip. Among other things, two sense amplifiers are now required to support the two sensing cycles, additional transfer gates and capacitors are required to set the bitlines to the proper reference voltages, and the memory cell capacitors must be two to three times larger to account for leakage and other losses due to the dual sensing cycle approach.

In addition to the problem of sensing, multiple level storage systems face a number of other problems which also must be addressed. For example, current digital I/O buffers are designed only to drive/receive data at high and low voltage levels and not data at one of n number of voltage levels (n greater than two). Similarly, all current PC processing components (e.g. CPUs, core logic, buses) are also designed to operate on digital (binary) data.

A need has therefore arisen for new circuitry and methods for implementing multivalued storage. The problem of accurately and quickly sensing data is one primary concern that must be addressed. To this end, the task of minimizing the size and complexity of the necessary circuitry cannot be ignored. Additionally, such circuitry and methods should be compatible with current digital devices and systems.

BRIEF DESCRIPTION OF THE DRAWINGS

For a more complete understanding of the present invention, and the advantages thereof, reference is now made to the following descriptions taken in conjunction with the accompanying drawings, in which.

SUMMARY OF THE INVENTION

Figure 1:
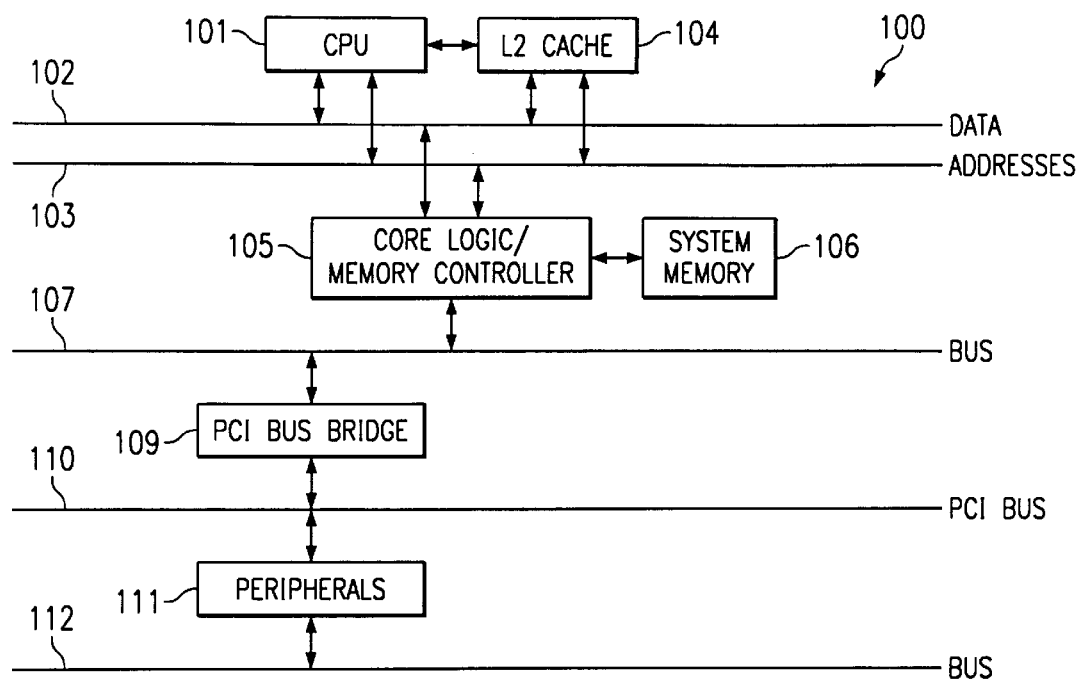
FIG. 1 is a high level block diagram of an exemplary personal computer system suitable for applying the principles of the present invention.

According to a first embodiment of the principles of the present invention, a multivalue memory cell is disclosed including a latch having a latching node and operating between a variable voltage rail and a fixed voltage rail. Circuitry is included for latching the node to the voltage level of the variable voltage rail, the voltage level at the latched node representing a data value. Circuitry is also provided for outputting the voltage level from the latched node.

According to another embodiment of the principles of the present invention, a multivalue memory device is disclosed which includes a bitline, a wordline, a memory cell and a variable voltage source. The memory cell includes a static random access memory (SRAM) cell having a power node and a latching node and a transistor for coupling a voltage presented on the bitline to the latching node in response to a voltage presented on the wordline, thereby causing a voltage presented on the power node to appear at the latching node. The variable voltage source holds a voltage selected from a plurality of available voltages through the power node.

According to a further embodiment of the principles of the present invention, a memory is disclosed including an array of rows and columns of memory cells. A plurality of bitlines are included, each associated with a column of cells. A plurality of wordlines are also included, each associated with a row of cells. Each memory cell includes a voltage selectable voltage rail, a latch operating between a selected voltage at the voltage rail and a fixed voltage, and a switch for selectively coupling a latching node of the latch to the bitline of the column including the cell in response to a signal presented on the wordline of the row including the cell.

The principles of the present invention are also provided in methods for storing multiple bits of data in a single memory cell. According to one such method, a plurality of bits of data can be stored in a single memory cell by setting a variable voltage rail to a selected voltage representing multi-bit digital data and selectively latching the selected voltage at a node to store the multibit digital data.

The present inventive concepts not only provide for multivalued storage in a single memory cell, but also address the problem of sensing multivalued data accurately and quickly. Circuits and systems embodying these principles are minimized in size and complexity are compatible with current digital devices and systems.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

DETAILED DESCRIPTION OF THE INVENTION

The principles of the present invention and their advantages are best understood by referring to the illustrated embodiment depicted in FIGS. 1–5 of the drawings, in which like numbers designate like parts.

FIG. 1 is a block diagram depicting a basic system architectures 100 typical of those found in desktop and notebook personal computers (PCs). While numerous variations on these basic architectures exist, FIG. 1 is suitable for describing the basic structure and operation of most PCs. In a handheld "PC", the system memory could be a SRAM, whereas a desktop/notebook PC uses DRAM for system memory.

System 100 includes a single central processing unit 101, CPU local data bus 102, CPU local address bus 103, external (L2) cache 104, core logic/memory controller 105, and system memory 106. In system 100A, the peripherals 108 are coupled directly to core logic/memory controller 105 via a bus 107. Bus 107 in this case is preferably a peripheral controller interface (PCI) bus, although alternatively it could be an ISA, general, or special purpose bus, as known in the art. In system 100B, core logic/memory controller 105 is again coupled to bus 107. A PCI bus bridge then interfaces bus 107 with a PCI bus 110, to which the peripherals 111 couple. An additional bus 112, which may be a ISA, PCI, VESA, IDE, general, or special purpose bus, is provided for access to peripherals 111 from an external device or system (not shown).

In single CPU system 100, CPU 101 is the "master" which, in combination with the operating system and applications software, controls the overall operation of system 100. Among other things, CPU 101 performs various data processing functions including numerical and word processing, generates graphics data, and performs overall system management. CPU 101 may be for example a complex instruction set computer (CISC), such as an Intel Pentium class microprocessor, a reduced instruction set computer (RISC), such as a Apple PowerPC microprocessor, or a very long instruction word (VLIW) machine.

CPU 101 communicates with the remainder of system 100 via CPU local address and data buses 102 and 103, each of which may be for example a special bus, or a general bus, as known in the art.

Core logic/memory controller 105, under the direction of CPU 101, controls the exchange of data, addresses, control signals and instructions between CPU 101, system memory 105, and peripherals 108/111 via bus 107 and/or PCI bus bridge 109. Although the core logic/memory controller allows tasks to be shifted from the CPU, thereby allowing the CPU to attend to other CPU-intensive tasks, the CPU can always override core logic/memory controller 105 to initiate execution of a higher priority task.

Core logic and memory controllers are widely available in the PC industry and their selection and application well known by those skilled in the art. The memory controller can be either a separate device or incorporated into the same chip set as the core logic. The memory controller is generally responsible for generating the memory clocks and control signals such as R/W and bank select (in multibank memory systems). The memory controller may also have some address generation capability for accessing sequences of pages.

The core logic is typically comprised of a chip-set, with one or more chips typically being "address and system controller intensive" and one or more chips typically being "data intensive." Among other things, the address intensive chip(s): interfaces CPU 101 with address bus 103; maintains cache memory (SRAM), i ncluding the cache tags, set associative cache tags and other data necessary to insure cache coherency; performs cache "bus snooping"; generates the control signals required for DRAMs in the system memory or cache; and controls general management transactions. The data intensive chip(s) generally: interfaces CPU 101 with the data bus 102; issues cycle completion responses; may abort operations if their cycles are incomplete; and arbitrates for the data path of bus 102.

CPU 101 can directly communicate with core logic/ memory controller 103 or through an external (L2) cache 104. L2 cache 104 may be for example a 256 KByte fast SRAM device(s). Typically, the CPU also maintains up to 16 kilobytes of on-chip (L1) cache.

PCI bus bridges, such as PCI bus bridge 109, are also well known to those skilled in the art. In the typical PC, the CPU is the bus master for the entire system and hence devices such as PCI bus bridge are slave devices which operate under command of the CPU.

Peripherals 107/111 may include a display controller and associated frame buffer, floppy drive controller, disk driver controller, and/or modem, to name only a few options.

Figure 2:
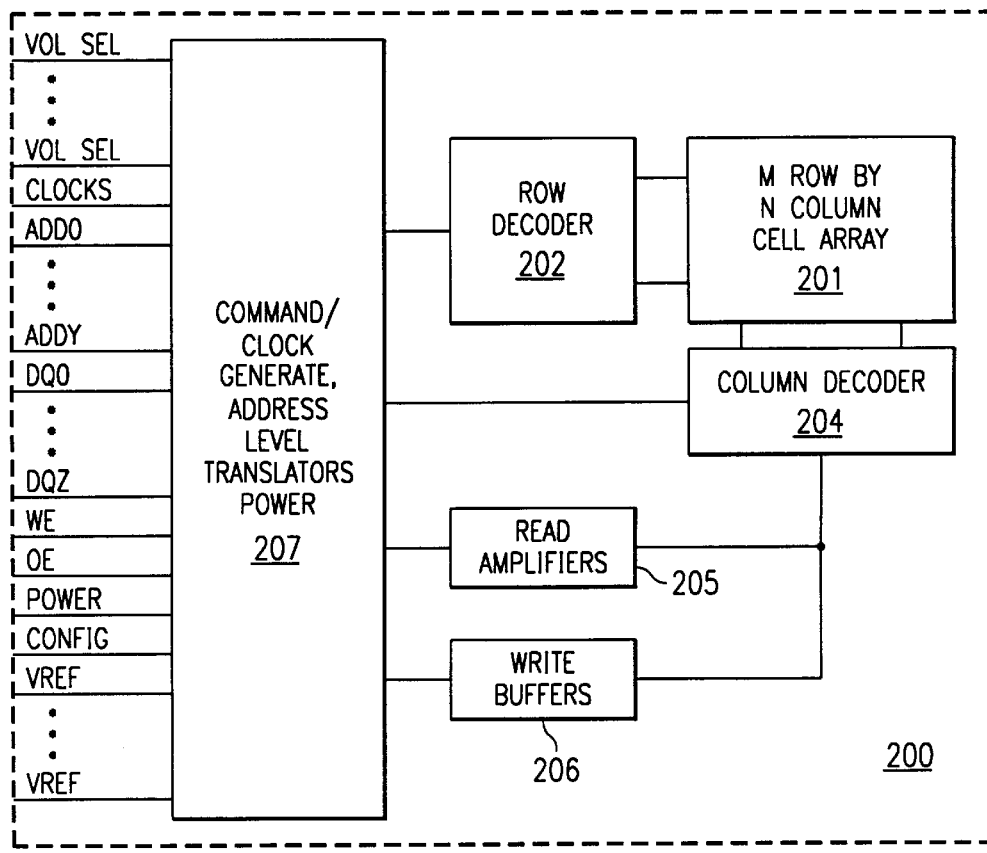
FIG. 2 is a block diagram of a memory subsystem or device which may be used in such applications as the system memory, or L2 cache memory shown in FIG. 3.

FIG. 2 is a high level functional block diagram of a memory 200 suitable for such applications as the construction of system memory 106. System memory for desktop PC's is DRAM. For handheld PC's or information appliances, the system memory could be a SRAM, to simplify memory controller design. Memory 200 includes an array 201 of rows and columns of the memory cells discussed below. A row of cells in array 201 is selected in response to a received row address by row decoder 202 which activates the conductive wordline coupled to the cells of the selected row. Each column of cells is associated by a conductive bitline consisting of a pair of complementary half-bitlines. During a read, the data from an entire row of cells are sensed Subsequently, column decoder 204, in response to a received column address, selectively passes a set of the desired data to the device I/O circuitry 207. A write operation is similar.

The data passed by column decoder 204 during a read operation may be directly driven through memory input/output (I/O) port DQ0-DQZ by the accessed cells themselves or optionally through a set of read amplifiers 205. During a write, write buffers 206 drive received data from the I/O port through the column decoder (which selects the bitlines of the cells to be written) and the sense amplifiers to array 201.

I/O block 207 generally includes the traditional I/O and control circuitry such as, address latches, read/write select and clock generation circuitry. In the illustrated embodiment, a non-multiplexed address bus is coupled to port ADD0-ADDY through which row and column addresses are concurrently input. The write enable (/WE) and output enable (/OE) control the input and output of data through the data port DQ0-DQZ.

In addition to the conventional memory control ports, one or two additional ports (depending on the embodiment) are now included. The first is j-bit wide VOLTAGE SELECT (VolSel) port and the second, which is used in embodiments where external reference voltages are used, is an k-bit wide $V_{REF}$ port.

Figure 3:
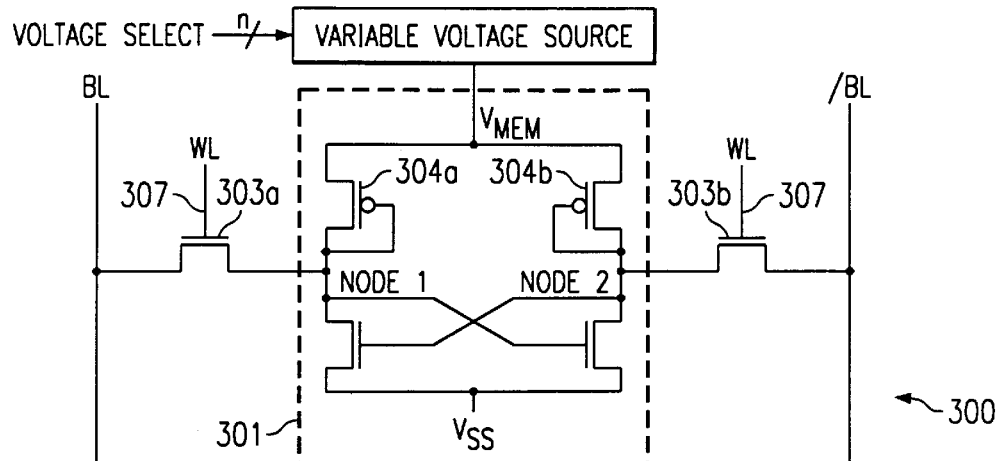
FIG. 3 is a circuitry level diagram of a memory cell according to the present inventive concepts and suitable for use in such applications as the data memory depicted in FIG. 3.

FIG. 3 is a circuit level diagram of a memory cell 300 embodying the principles of the present invention. Cell 300 includes a static random access cell 301 coupled to a pair of complementary bitlines 302a and 302b, through a corresponding set of transistors 303a and 303b. The gates of transistors 303 are controlled by a voltage impressed on a corresponding wordline (WL) 307. In the illustrated embodiment, SRAM cell 301 includes a pair of p-channel load transistors 304a and 304b and a pair of latching n-channel transistors 305 having gates cross-coupled to latching nodes Node 1 and Node 2. When forming part of an array, bitlines 302 are common with similar cells 300 along a physical column and wordline 307 is common with the cells 300 along a physical row.

According to the principles of the present invention SRAM cell 301 operates between a voltage rail set to a low voltage level, such as $V_{SS}$ and variable voltage rail carrying a voltage $V_{MEM}$ from a variable voltage source 306. Data received at the VOLTAGE SELECT (VolSel) port selects $V_{MEM}$ (in addition to selection data for an internal source of $V_{MEM}$, this port may alternatively be used to directly receive $V_{MEM}$ from an external source). By varying $V_{MEM}$, the voltages at latching Nodes 1 and 2 are consequently varied between approximately 0v and a predetermined maximum value of $V_{MEM}$. The absolute voltage difference between the two nodes (approximately $V_{MEM}$) is a voltage encoded logic state which can subsequently be decoded into multi-bits of binary data. The number of available voltage levels and the actual voltages will vary from application to application, but are generally selected as a function of the number of bits to be stored in cell 300. Variable voltage source 306 may be external to the device or provided on chip along with cell(s) 300.

Figure 4:
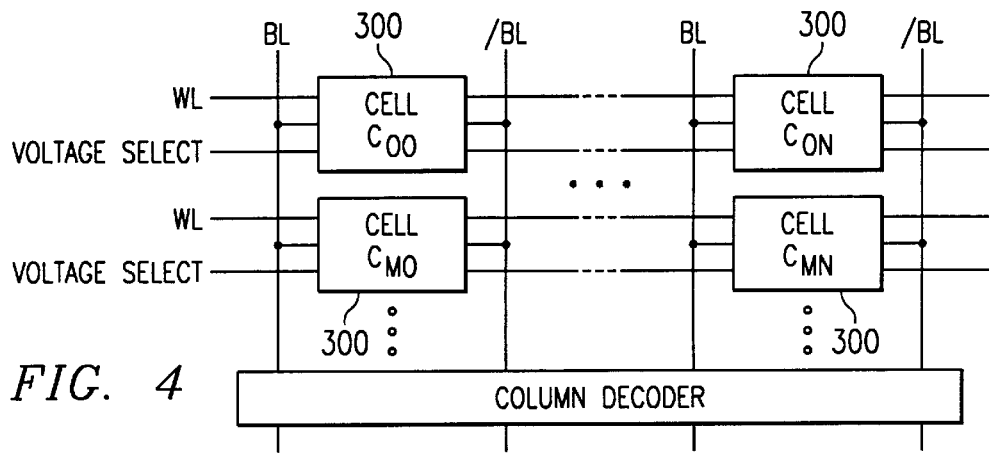
FIG. 4 is a block diagram of a portion of a memory core which includes an array of cells similar to those shown in FIG. 3.

FIG. 4 is a block diagram of a portion of a memory core 400, which includes an array of memory cells 300 arranged in m number of rows and n number of columns. The cells have been labeled $C_{ij}$, where i is the row number from 0 to m−1 and j is the column number from 0 to n−1. It should be noted that in actual implementation, the number of cells in core memory 400 may range from a very few to several billion, depending on the application.

The preferred embodiment is shown in FIG. 4 where the data encoded as voltage ($V_{MEM}$) values are simply driven and received through device I/O 207 via the bitlines 302. It should be noted that if the SRAM cell 301 of cell 300 is designed with sufficient drive, no read amplifier is needed. Column decoders 403 can be used to selectively exchange data between the columns (bitlines) and device I/O circuitry 207 in response to column address.

In view of FIGS. 3 and 4, consider the case where four values of $V_{MEM}$ are available, respectively 0V, 1V, 2V and 3V. One of four binary values can then be stored per cell 300, for example as is shown in TABLE 1.

| BINARY STATE | | $|V_{BL} - V_{/BL}|$* | $|V_{NODE\ 1} - V_{NODE\ 2}|$ | $V_{MEM}$ |
|---|---|---|---|---|
| 0 | 0 | 0V | 0V | 0V |
| 0 | 1 | 1V | 1V | 1V |
| 1 | 0 | 2V | 2V | 2V |
| 1 | 1 | 3.3V | 3.3V | 3.3V |

*In post latching equilibrium.

During a write to a given cell 300, the corresponding row is selected by activating the appropriate wordline 307. Transistors 302 of cell 300 turn-on and couple Nodes 1 and 2 of the cell to bitlines 302 of the corresponding column.

The high voltage rail has been set to $V_{MEM}$ in accordance with TABLE I to the voltage level representing the logic (binary) bits being stored. A voltage is applied between bitlines BL and /BL to latch $V_{MEM}$ into either Node 1 or Node 2, depending on which bitline BL or /BL is carrying the higher voltage. For differential driving, it does not matter which bitline 302 is pulled high and which is pulled low for a given cell 300. For single ended driving, one bitline 302a or 302b is selected to always carry the data and the voltage on the complementary bitline is discarded. The voltage used to drive bitlines 302 during a write could be, for example, Vcc and Vss, or a suitable voltages capable of causing SRAM 301 to quickly latch. The very small drive of the bitlines 302 initiate latching after which the voltage at the $V_{MEM}$ and $V_{SS}$ rails dominate. The wordline 307 is deactivated after the SRAM cell 301 of cell 300 has latched the data.

During a read from the given cell 300, the corresponding wordline 307 is again activated and the voltages held on Nodes 1 and 2 are driven on to bitlines 302a and 302b (or on a single bitline 302 in the single ended case) to the column decoder. It should be noted that bitlines 302 do not require precharge so long as the source of $V_{Men}$ has sufficient drive. Depending on the column address, the data is driven to the device I/O 207 by the SRAM cell 301 itself.

Figure 5:
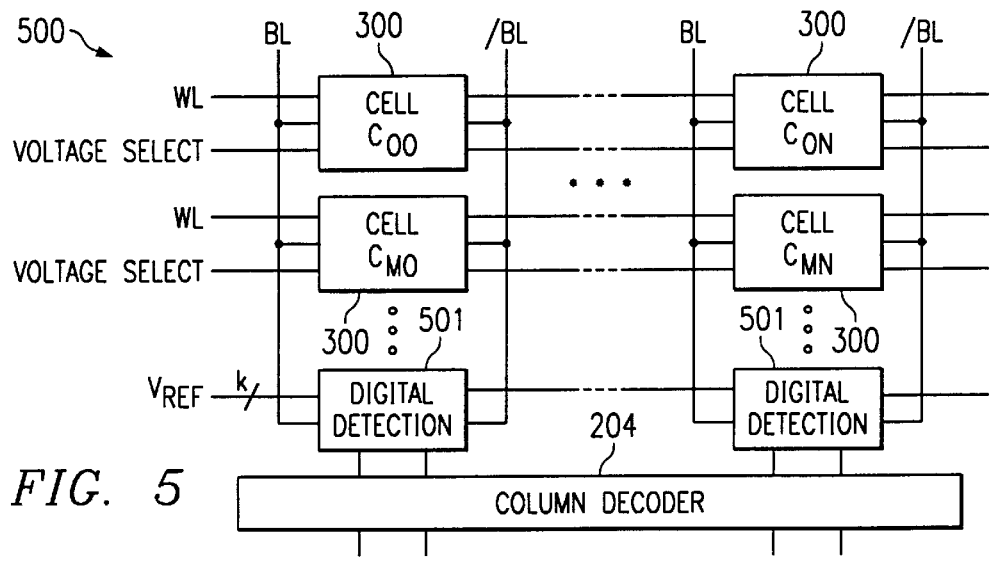
FIG. 5 is a block diagram of a portion of an alternate memory core which includes an array of cells similar to those shown in FIG. 3.

FIG. 5 shows an alternate embodiment 500 where the voltage encoded data from memory cells 300 is decoded on-chip using digital detection circuitry 501. The read and write operations proceed in the same fashion as described above. An internally or externally generated stepped reference voltage $V_{Ref}$, or alternatively multiple fixed reference values $V_{Refk}$ presented to reference voltage port $V_{REF}$ (FIG. 2), are used by detectors 401 to detect (decode) the voltage encoded data output from cells 300 of the active row. Specifically, the voltage output from the corresponding cell on the bitline or bitlines 302 of a given column is compared against each voltage step of $V_{Ref}$ or alternatively against each of the fixed reference voltages $V_{REFK}$, depending on which method is selected. The highest reference voltage which the $V_{MEM}$ meets or exceeds corresponds to the logic state and decoded into a binary word.

Consider again the four voltage case ($V_{MEM}$=0V, 1V, 2V or 3.3V) case discussed above and assume again that the decoding protocol is as defined in Table 1. Three reference voltage steps can then be selected which approximately fall between the four values of $V_{MEM}$, for example, 0.5V, 1.5V and 2.5V. For discussion purposes, the voltage output from cell 300 is approximately $V_{MEM}$=2 volts. $V_{MEM}$ is first compared against 0.5V and then against 1.5 volts, and since $V_{MEM}$ is above these references, the voltage comparison continues to the 2.5 volt reference. Since $V_{MEM}$ is below the 2.5V reference and above the 1.5V reference, the data is taken as 2V and interpreted accordingly with Table 1.

It should be noted that in the example above, a four bit per cell scheme was assumed. The number of bits per cell can be increased by increasing the number of possible values of $V_{MEM}$ or reduced by decreasing the number of possible values of $V_{MEM}$. The number of reference voltage steps will accordingly vary.

In a further embodiment, both the voltage $V_{MEM}$ and the latching state of the cell SRAM cell 301 can be taken into account in determining the binary state of the data. A four bit per cell example is illustrated by Table 2. In this case, only two values of $V_{MEM}$ are required along with a determination of the two possible latching states of Nodes 1 and 2. Table 3 illustrates a 6 bit per cell example utilizing the two possible states of Node 1 and Node 2 and three values of $V_{MEM}$. It should be noted that in actual implementation of the present concepts, additional bits can be stored per cell by providing additional possible levels of $V_{MEM}$ and/ or using a different scheme of decoding $V_{MEM}$ and the latching state of the SRAM cell 301.

TABLE II

| BINARY STATE | | BL* | /BL* | $V_{MEM}$* | NODE 1* | NODE 2* |
|---|---|---|---|---|---|---|
| 0 | 0 | 0 | 1V | 1V | 0V | 1V |
| 0 | 1 | 1V | 0V | 1V | 1V | 0V |
| 1 | 0 | 0V | 2V | 2V | 0V | 2V |
| 1 | 1 | 2V | 0V | 2V | 2V | 0V |

*In equilibrium after latching.

TABLE III

| DIGITAL STATE | | | BL* | /BL* | $V_{MEM}$ | NODE 1* | NODE 2* |
|---|---|---|---|---|---|---|---|
| 0 | 0 | 0 | 0V | 1V | 1V | 0V | 1V |
| 0 | 0 | 1 | 1V | 0V | 1V | 1V | 0V |
| 0 | 1 | 0 | 0V | 2V | 2V | 0V | 2V |
| 0 | 1 | 1 | 2V | 0V | 2V | 2V | 0V |

TABLE III-continued

| DIGITAL STATE | | | BL* | /BL* | $V_{MEM}$ | NODE 1* | NODE 2* |
|---|---|---|---|---|---|---|---|
| 1 | 0 | 0 | 0V | 3.3V | 3.3V | 0V | 3.3V |
| 1 | 0 | 1 | 3.3V | 0V | 3.3V | 3.3V | 0V |

*In equilibrium after latching.

One of the many uses of memories utilizing the present inventive concepts is in low cost computing systems, such as "network" computers. In network computers, the end user maintains a terminal with a minimum of processing power. The local memory is also very small. The main repository of software and the site of major processing power is with an associated server. Multivalued memory can be used to construct the small, user-terminal local memory inexpensively. Multivalued memory is, of course, useful in the system memory and cache memory construction in full processing systems and devices.

Although the invention has been described with reference to a specific embodiments, these descriptions are not meant to be construed in a limiting sense. Various modifications of the disclosed embodiments, as well as alternative embodiments of the invention will become apparent to persons skilled in the art upon reference to the description of the invention. It is therefore, contemplated that the claims will cover any such modifications or embodiments that fall within the true scope of the invention.

What is claimed is:

1. A multivalued memory cell comprising:

a latch having a latching node and operating between a variable voltage rail and a fixed voltage rail;

circuitry for a latching said node to a voltage level of said variable voltage rail, said voltage level at said latched node representing a data value;

circuitry for outputting said voltage level from said latching node; and a dynamically variable voltage source for setting said voltage level of said variable voltage rail to one of i number of voltage levels and said memory cell is operable to store i number of words of data, where i is an integer greater than or equal to three.

2. The memory cell of claim 1 wherein said voltage level represents a multi-bit binary data value.

3. The memory cell of claim 1 wherein said circuitry for latching comprises a pass transistor having a path for coupling a voltage to a selected one of said nodes from a first conductor and a control node coupled to a second conductor.

4. A multivalued memory device comprising:

a bitline;

a wordline;

a memory cell comprising:

a static random access memory cell having a power node and a latching node; and a transistor for coupling a voltage presented on said bitline to said latching node in response to a voltage presented on said wordline and causing a voltage presented on said power node to appear at said latching node; and a dynamically variable voltage source for coupling a voltage selected from a plurality of available voltages to said power node for providing one of at least three possible voltage levels at said latching node.

5. The memory device of claim 4 wherein said source of a variable voltage comprises an internal variable voltage source operable to generate said plurality of available voltages in response to at least one bit of voltage select information.

6. The memory device of claim 4 wherein said source of a variable voltage comprises circuitry for receiving said plurality of available voltages from and external source.

7. The memory device of claim 4 and further comprising digital detection circuitry coupled to said bitline for converting a said voltage presented at said latching node to a digital value.

8. The memory device of claim 5 wherein said source of a variable voltage is operable to select a voltage from said plurality of variable voltages in response to a received digital signal.

9. A memory comprising:
   an array of rows and columns of memory cells;
   a plurality of bitlines each associated with a said column of cells;
   a plurality of wordlines each associated with a said row of cells; and
   wherein each of said memory cells comprises:
      a voltage-selectable voltage rail, said voltage selectable during the operation of said memory to provide one of at least three possible data levels;
      a latch operating between a selected voltage at said voltage rail and a fixed voltage; and
      a switch for selectively coupling a latching node of said latch to said bitline of a said column including said cell in response to a signal presented on said wordline of said row including said cell.

10. The memory of claim 9 wherein said source of a selectable voltage rail is operable to select said selected voltage rail in response to a received signal.

11. The memory of claim 10 wherein said selected voltage represents a multi-bit digital value.

12. The memory of claim 9 wherein said source of a selectable voltage rail comprises circuitry for receiving said selected voltage from an external device.

13. The memory of claim 9 wherein said source of a selected voltage rail comprises an internal voltage generator.

14. The memory of claim 9 wherein said latch comprises a static random access memory cell.

15. A method of storing a plurality of bits of data in a single memory cell comprising the steps of:
   dynamically setting a variable voltage rail to a selected voltage representing multi-bit digital data, said step of setting the voltage rail including the substep of selecting one of i number of available voltages to store a corresponding one of i number of digital logic states, where i is greater than or equal to three; and
   selectively latching the selected voltage at a node to store the multi-bit digital data.

16. The method of claim 15 wherein said step of selectively latching comprises the step of latching the selected voltage to a node of a static random access memory cell.

17. The method of claim 15 wherein said step of selectively latching comprises the substep of applying a voltage to a pass transistor to couple a latching voltage to the node.

* * * * *